US009748736B1

(12) United States Patent
Ma et al.

(10) Patent No.: US 9,748,736 B1
(45) Date of Patent: Aug. 29, 2017

(54) WAVEGUIDE EMBEDDED PLASMON LASER WITH MULTIPLEXING AND ELECTRICAL MODULATION

(71) Applicants: Ren-min Ma, Albany, CA (US); Xiang Zhang, Alamo, CA (US)

(72) Inventors: Ren-min Ma, Albany, CA (US); Xiang Zhang, Alamo, CA (US)

(73) Assignee: The Regents of The University of California, Oakland, CA (US)

( * ) Notice: Subject to any disclaimer, the term of this patent is extended or adjusted under 35 U.S.C. 154(b) by 973 days.

(21) Appl. No.: 14/052,504

(22) Filed: Oct. 11, 2013

Related U.S. Application Data

(60) Provisional application No. 61/714,553, filed on Oct. 16, 2012.

(51) Int. Cl.
*H01S 5/10* (2006.01)
*H01S 5/40* (2006.01)
*H01S 3/063* (2006.01)

(52) U.S. Cl.
CPC .......... *H01S 5/1046* (2013.01); *H01S 3/0632* (2013.01); *H01S 5/1042* (2013.01); *H01S 5/4031* (2013.01)

(58) Field of Classification Search
CPC ............................... H01S 5/104; H01S 3/0632
See application file for complete search history.

(56) References Cited

U.S. PATENT DOCUMENTS

| 7,949,210 | B2* | 5/2011 | Durfee | G02F 1/035 385/1 |
| 8,509,276 | B2 | 8/2013 | Zhang | |
| 2010/0014808 | A1* | 1/2010 | Flammer | B82Y 20/00 385/37 |
| 2010/0310205 | A1* | 12/2010 | Liu | B82Y 20/00 385/2 |
| 2010/0316325 | A1* | 12/2010 | Okamoto | B82Y 20/00 385/3 |
| 2011/0170822 | A1* | 7/2011 | Avrutsky | B82Y 20/00 385/11 |
| 2012/0250720 | A1* | 10/2012 | DeLeon | H01S 3/063 372/98 |

OTHER PUBLICATIONS

Ren-Min Ma, Xiaobo Yin, Rupert F. Oulton, Volker J. Sorger, & Xiang Zhang, "Multiplexed and electrically modulated plasmon laser circuit," Nano Letters, 2012, 12 (10), pp. 5396-5402.
Ren-Min Ma et al., "Directionally emitting plasmon lasers with multiplexing and electrical modulation," Frontiers in Optics, San Jose, California United States, Oct. 16-20, 2011.
(Continued)

*Primary Examiner* — Jessica Manno
*Assistant Examiner* — Sean Hagan
(74) *Attorney, Agent, or Firm* — Lawrence Berkeley National Laboratory (57) ABSTRACT

This disclosure provides systems, methods, and apparatus related to nanometer scale lasers. In one aspect, a device includes a substrate, a line of metal disposed on the substrate, an insulating material disposed on the line of metal, and a line of semiconductor material disposed on the substrate and the insulating material. The line of semiconductor material overlaying the line of metal, disposed on the insulating material, forms a plasmonic cavity.

12 Claims, 6 Drawing Sheets

(56) References Cited

OTHER PUBLICATIONS

Ren-Min Ma et al., "Directionality and Integration of Nanoscale Plasmon Lasers," 2012 Conference on Lasers and Electro-Optics (CLEO), May 6-11, 2012.
Miller, D. A. B. Rationale and challenges for optical interconnects to electronic chips. Proceedings of the IEEE 88 728-749 (2000).
Noginov, M. A. et al. Demonstration of a spaser-based nanolaser. Nature 460, 1110-1113 (2009).
Ma, R.-M., Oulton, R. F., Sorger, V. J., Bartal, Guy. & Zhang, X. Room-temperature sub-diffraction-limited plasmon laser by total internal reflection. Nature Materials 10, 110-113 (2011).
Oulton, R. F., et al. "Plasmon lasers at deep subwavelength scale" Nature 2009, 461, 629-632.
Hill, M. T., et al. "Lasing in metal-insulator-metal sub-wavelength plasmonic waveguides" Optics Express 2009, 17, 11107-11112.
Kwon, S.-H., et al. "Subwavelength Plasmonic Lasing from a Semiconductor Nanodisk with Silver Nanopan Cavity" Nano Lett. 2010, 10, 3679-3683.
Khajavikhan, M., et al. "Thresholdless nanoscale coaxial lasers" Nature 2012, 482, 204-207.
Maier, S. A., et al. "Local detection of electromagnetic energy transport below the diffraction limit in metal nanoparticle plasmon waveguides" Nat. Mater. 2003, 2, 229-232.
Barnes, W. L., et al. "Surface plasmon subwavelength optics" Nature 2003, 424, 824-830.
MacDonald, K. F., et al. "Ultrafast active plasmonics" Nat. Photonics 2009, 3, 55-58.
Gramotnev, D. K., et al. "Plasmonics beyond the diffraction limit" Nat. Photonics 2010, 4, 83-91.
Cai, W., et al. "Elements for Plasmonic Nanocircuits with Three-Dimensional Slot Waveguides" Adv. Mater. 2010, 22, 5120-5124.
Ma, R.-M., et al. "High-Performance Nano-Schottky Diodes and Nano-MESFETs Made on Single CdS Nanobelts" Nano Lett. 2007, 7, 868-873.
Dulton, R. F., et al. "A hybrid plasmonic waveguide for subwavelength confinement and long-range propagation" Nat. Photonics 2008, 2, 496-500.

* cited by examiner

WAVEGUIDE EMBEDDED PLASMON LASER WITH MULTIPLEXING AND ELECTRICAL MODULATION

RELATED APPLICATIONS

This application claims priority to U.S. Provisional Patent Application No. 61/714,553, filed Oct. 16, 2012, which is herein incorporated by reference. This application is related to U.S. Pat. No. 8,509,276, which is herein incorporated by reference.

STATEMENT OF GOVERNMENT SUPPORT

This invention was made with government support under Contract No. DE-AC02-05CH11231 awarded by the U.S. Department of Energy and under Contract No. FA9550-12-1-0197 awarded by the U.S. Air Force Office of Scientific Research. The government has certain rights in this invention.

FIELD

Embodiments described herein relate to the field of lasers, and particularly relate to nanometer scale lasers.

BACKGROUND

Regarded as the key driver of ultra-dense optoelectronic circuitry, single-molecule sensing, and ultrahigh-density data storage, nanoscale lasers have attracted much attention. The development of nanoscale lasers is rapidly advancing and a variety of approaches have been explored, including Fabry-Perot lasers, whispering gallery lasers, photonic crystal lasers, and metallic lasers. Recently, plasmon lasers with both physical size and optical mode confinement below the diffraction limit of light in a different number of dimensions have been demonstrated using localized surface plasmons bound to metal surfaces. With the ability to generate intense electromagnetic radiation at the nanoscale in femtosecond timescales, plasmon lasers now stimulate the exploration of broad scientific and technological innovation at the nanometer-scale.

SUMMARY

Embodiments of a directionally emitting waveguide embedded (WEB) plasmon laser that efficiently convert coherent surface plasmons from a small laser cavity into an embedded photonic semiconductor waveguide are disclosed herein. In some embodiments, a WEB plasmon laser has an enhanced radiation efficiency of about 35%. Effective electrical modulation and wavelength multiplexing of WEB plasmon lasers at room temperature have been demonstrated experimentally. The hybrid photonic and plasmonic circuit may integrate four functions, including: multi-colored plasmon light sources, direct electrical modulation, efficient waveguide collection and out-coupling, and wavelength multiplexing in a compact configuration, paving the way towards large scale on-chip integrated hybrid optoelectronic circuitry.

Details of one or more embodiments of the subject matter described in this specification are set forth in the accompanying drawings and the description below. Other features, aspects, and advantages will become apparent from the description, the drawings, and the claims. Note that the relative dimensions of the following figures may not be drawn to scale.

DETAILED DESCRIPTION

Reference will now be made in detail to some specific examples of the invention including the best modes contemplated by the inventors for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims.

In the following description, numerous specific details are set forth in order to provide a thorough understanding of the present invention. Particular example embodiments of the present invention may be implemented without some or all of these specific details. In other instances, well known process operations have not been described in detail in order not to unnecessarily obscure the present invention.

Various techniques and mechanisms of the present invention will sometimes be described in singular form for clarity. However, it should be noted that some embodiments include multiple iterations of a technique or multiple instantiations of a mechanism unless noted otherwise.

Introduction

Critical challenges remain that need to be addressed before plasmon lasers can be utilized as integrated light sources. Firstly, the large momentum mismatch of light inside and outside of a deep sub-wavelength plasmon cavity results in diffraction into all directions, inhibiting directional emission and efficient collection of optical power from a plasmon laser for practical applications. Furthermore, due to the intrinsic metal Ohmic loss limited quality factor, the radiation efficiency of plasmon lasers may be very low. The devices deliver energy to the nanoscale plasmonic mode but release a small part of their optical energy to the far field before it is dissipated in the metal. Lastly, scaling down integrated photonics requires multiplexed nanolasers with direct on-chip electrical modulation, which places constraints on the integration of driving electronics without disturbing the cavity mode or increasing the device footprint.

An integrated waveguide embedded (WEB) plasmon laser that can efficiently convert surface plasmons into directional laser emission by launching more than 70% of its radiation into a semiconductor nanobelt waveguide is disclosed herein. Due to this efficient conversion, the radiation efficiency of the plasmon laser has been enhanced about 20 times to 35%. Further disclosed is an array of five WEB lasers with different colors multiplexed onto a single semiconductor waveguide. Each of these plasmon lasers has a sub-micron footprint and can operate at room temperature. Moreover, this unique design integrates electronic and photonic elements, enabling independent direct electrical modulation of each plasmon laser. A maximum modulation depth of 11 dB for 1 volt (V) of bias sweep may be obtained. These unique properties demonstrate an intriguing hybrid photonic and plasmonic circuit that integrates multi-color nanoscopic plasmon lasers with direct electrical modulation and wavelength multiplexing onto a single photonic semiconductor waveguide.

Apparatus/Methods

Figure 1:
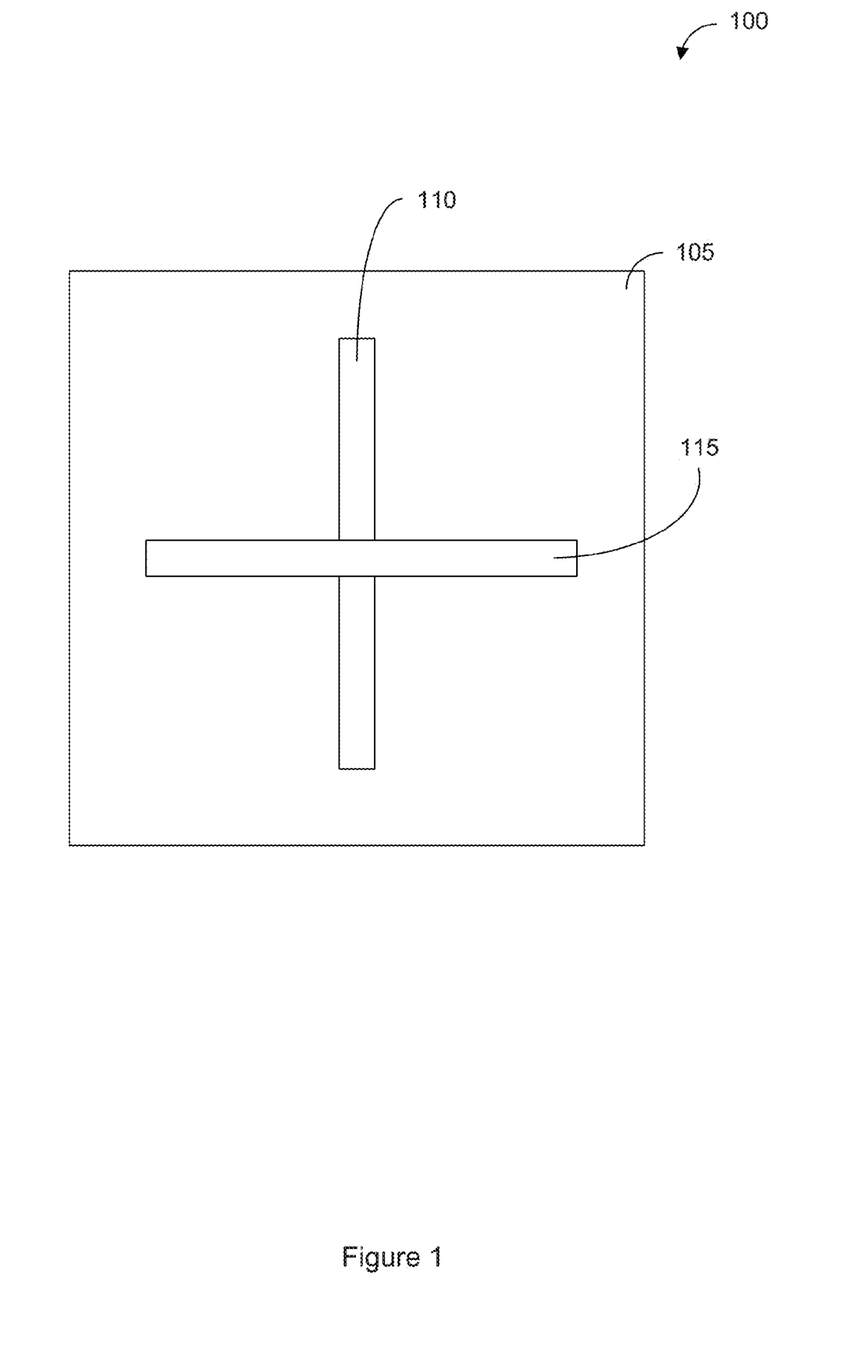
FIG. 1 shows an example of a top-down schematic illustration of a waveguide embedded (WEB) plasmon laser.

FIG. 1 shows an example of a top-down schematic illustration of a waveguide embedded (WEB) plasmon laser. As shown in FIG. 1, the WEB plasmon laser 100 includes a substrate 105, a line of metal 110 disposed on the substrate, an insulating material (not shown) disposed on the line of metal 110, and a line of semiconductor material 115 disposed on the substrate 105 and the insulating material. The line of semiconductor material 115 overlaying the line of metal 105, disposed on the insulating material, forms a plasmonic cavity. In some embodiments, a width of the line of semiconductor material disposed on the insulating material determines a resonant condition of the plasmonic cavity. This in turn determines an emission wavelength of the device.

In some embodiments, the line of semiconductor material includes a first end and a second end. A first electrode (not shown) may be associated with the first end, and a second electrode (not shown) may be associated with the second end. In some embodiments, the first and the second electrodes may include an indium-gold alloy or a layer of gold combined with a layer of indium.

In some embodiments, instead of the electrodes being associated with a first end and a second end of the line of semiconductor material, the line of semiconductor material may overlay each of the first and the second electrodes. The line of semiconductor material may overlay one of the electrodes on one side of where the line of semiconductor material overlays the insulating material and overlay the other of the electrodes on the other side of where the line of semiconductor material overlays the insulating material.

In some embodiments, instead of the electrodes being associated with a first end and a second end of the line of semiconductor material, the first and the second electrodes overlay the line of semiconductor material. The first electrode may overlay the line of semiconductor material on one side of where the line of semiconductor material overlays the insulating material, and the second electrode may overlay the line of semiconductor material on the other side of where the line of semiconductor material overlays the insulating material.

In some embodiments, the line of semiconductor material disposed on the insulating material is configured to be optically pumped. This may cause an end of the line of semiconductor material to emit electromagnetic radiation.

In some embodiments, the substrate may include any of a number of different materials. In some embodiments, the substrate may be a silicon wafer. In some embodiments, a silicon wafer may be oxidized to produce a silicon dioxide layer, with the WEB plasmon laser being disposed on the silicon dioxide layer.

In some embodiments, a metal of the line of metal may include silver, gold, or aluminum. In some embodiments, the line of metal may be about 10 nanometers thick or thicker than about 10 nanometers. In some embodiments, the line of metal may be about 10 nanometers to 10 micrometers wide.

In some embodiments, the insulating material may include magnesium fluoride or another insulating material. In some embodiments, the insulating material may be about 0.1 nanometers to 50 nanometers thick, about 2.5 nanometers to 7.5 nanometers thick, or about 5 nanometers thick.

In some embodiments, the semiconductor material of the line of semiconductor material may include cadmium sulfide. Dye molecules that can provide an optical gain and other semiconductor materials also may be included in the line of semiconductor material. In some embodiments, the line of semiconductor material may be about 10 nanometers to 10 micrometers thick. In some embodiments, the line of semiconductor material may be about 10 nanometers to 10 micrometers wide.

In some embodiments, the line of semiconductor material may be substantially perpendicular to the line of metal.

In some embodiments, the line of metal may be replaced with a line of heavily doped semiconductor. In some other embodiments, the insulating material may not be included in the WEB plasmon laser.

Figure 2:
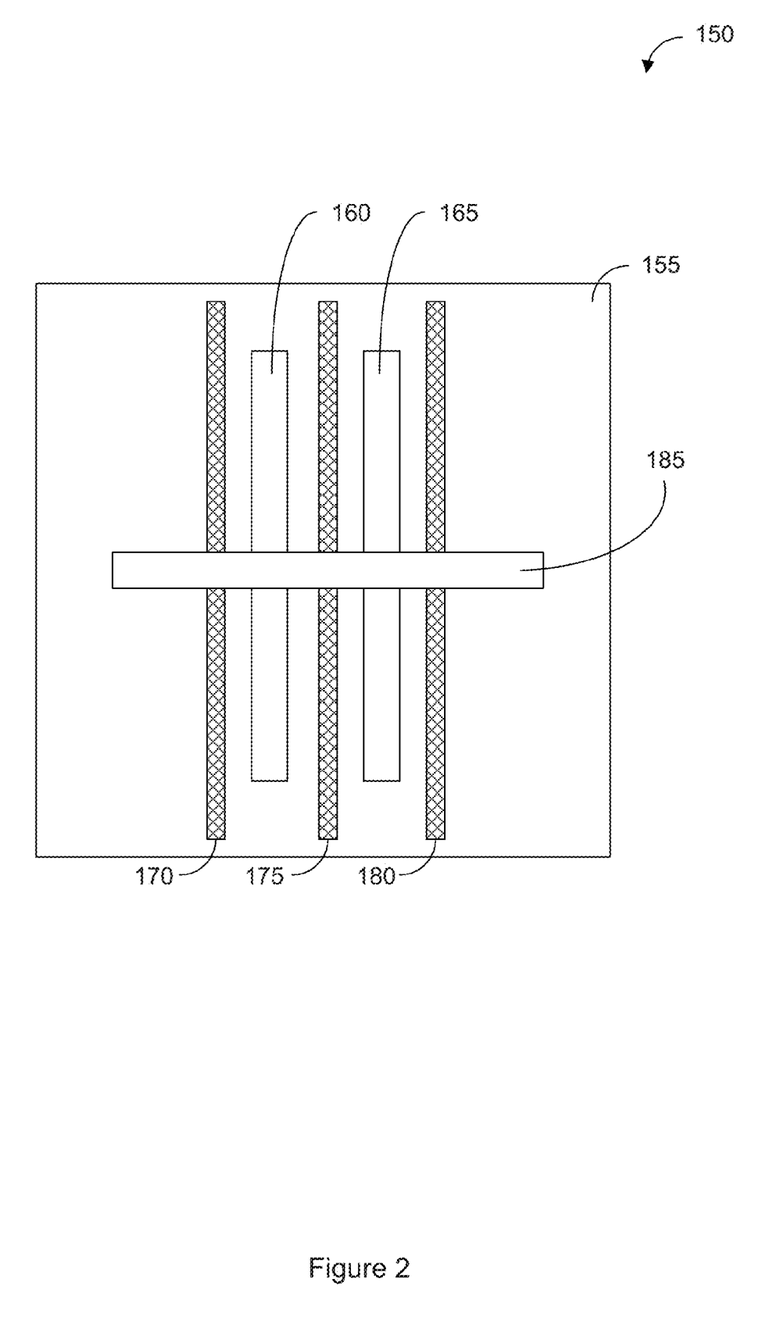
FIG. 2 shows an example of a top-down schematic illustration of an array of waveguide embedded (WEB) plasmon lasers.

FIG. 2 shows an example of a top-down schematic illustration of an array of waveguide embedded (WEB) plasmon lasers. As shown in FIG. 2, the array of WEB plasmon lasers 150 includes a substrate 155. A first line of metal 160 and a second line of metal 165 are disposed on the substrate. An insulating material (not shown) is disposed on the first line of metal 160 and the second line of metal 165. A first electrode 170, a second electrode 175, and a third electrode 180 are also disposed on the substrate 155. The lines of metal and the electrodes arranged such that the first line of metal 160 is between the first electrode 170 and the second electrode 175, and the second line of metal 165 is between the second electrode 175 and the third electrode 180.

A line of semiconductor material 185 is disposed on the substrate 155 and the insulating material. The line of semiconductor material 175 overlaying the first line of metal 160, disposed on the insulating material, forms a first plasmonic cavity. The line of semiconductor material 175 overlaying the second line of metal 165, disposed on the insulating material, forms a second plasmonic cavity.

In some embodiments, the first electrode 170, the second electrode 175, and the third electrode 180 overlay the line of semiconductor material 185.

In some embodiments, a first width of the line of semiconductor material overlaying the first line of metal determines a resonant condition of the first plasmonic cavity and an emission wavelength of the first plasmonic cavity. A second width of the line of semiconductor material overlaying the second line of metal determines a resonant condition of the second plasmonic cavity and an emission wavelength of the second plasmonic cavity. Thus, each of the plasmonic cavities may emit a different wavelength of electromagnetic radiation.

The array of WEB plasmon lasers 150 includes two plasmonic cavities. More plasmonic cavities can be created by including further lines of metal, and further electrodes may also be included.

Embodiments of the devices disclosed herein may be used in, for example, ultra-dense optoelectronic circuitry, on-chip photonic interconnectors, ultrahigh-density data storage applications, new type of sensors, and new type of displays.

Chemical vapor deposition (CVD), atomic layer deposition (ALD), and physical vapor deposition (PVD; e.g., electron beam evaporation) processes may be used to deposit the line of metal, the insulating material, and the line of semiconductor material. Electron beam lithography techniques may be used to define the regions onto which different materials are deposited. One of ordinary skill in the art could fabricate the devices disclosed herein using these techniques, as well as other microfabrication techniques.

Example

Below is a description of the development of, experiments performed with, and simulations of WEB plasmon lasers. The below description is intended cover examples of the embodiments disclosed herein, and is not intended to be limiting.

Figure 3:
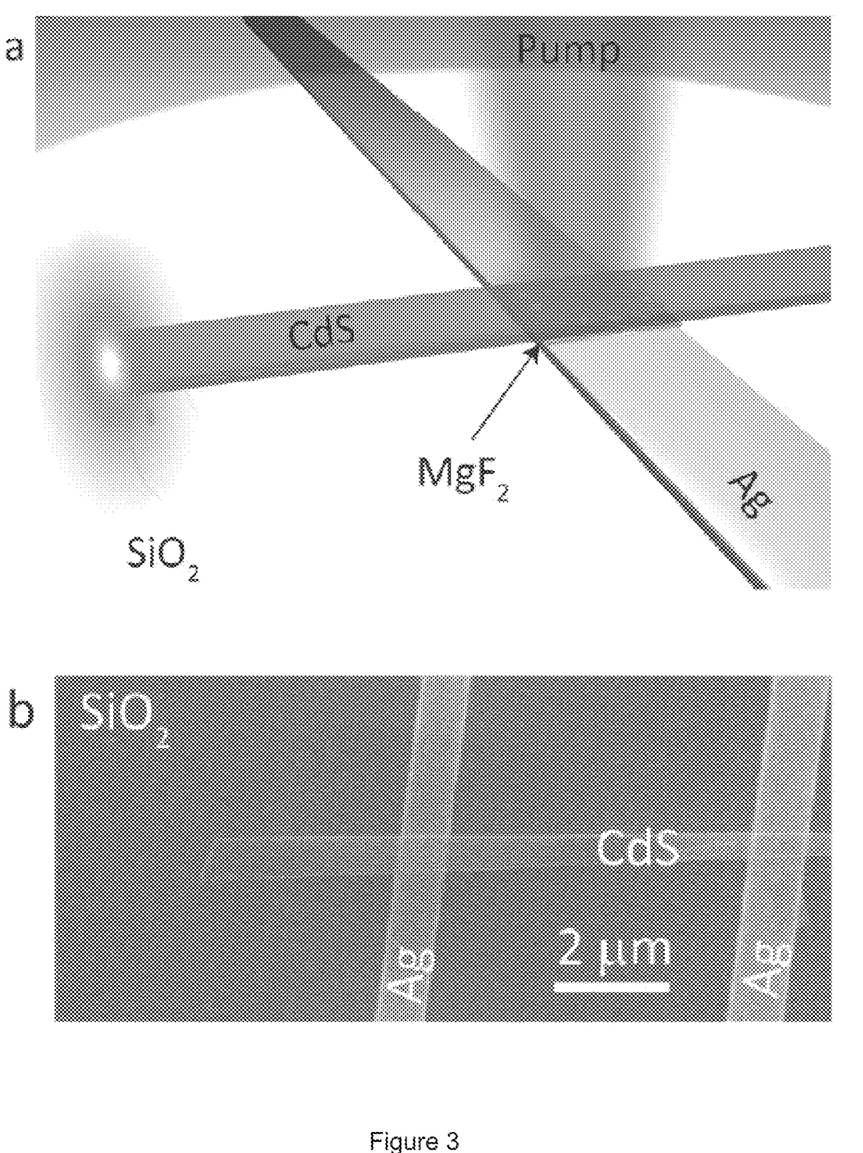
FIGS. 3a and 3b show examples of a waveguide embedded (WEB) plasmon laser with directional emission.

FIGS. 3a and 3b show examples of a waveguide embedded (WEB) plasmon laser with directional emission. In some embodiments, a WEB plasmon laser may be fabricated by crossing a semiconductor cadmium sulfide (CdS) nanobelt waveguide over a silver strip with an about 5 nm thick magnesium fluoride ($MgF_2$) gap layer. At the semiconductor-metal intersection, the surface plasmon effect induces a high effective refractive index, forming a square shaped plasmon laser cavity. The dominant radiative loss of the cavity is scattering into the semiconductor waveguide that guides the majority of the laser radiation into desired directions (FIG. 3a). A CdS nanobelt with high luminescence quantum efficiency serves as both a gain medium in the laser cavity and a semiconductor waveguide outside for emitted laser light. The 5 nm $MgF_2$ gap layer is used to pull the electric field into the gap region thus confining the plasmonic mode significantly below the diffraction limit of light with relatively low metal Ohmic loss.

FIG. 3b shows a SEM micrograph of a WEB plasmon laser. The WEB plasmon laser comprises a 620 nm wide, 100 nm thick CdS nanobelt crossing a 250 nm thick, 790 nm wide silver strip separated by a 5 nm $MgF_2$ gap. The footprint of the plasmon laser was about 0.48 $\mu m^2$. The directional emission of the laser was observed by optically pumping the cavity region and imaging the scattered light. At pump intensities above the laser threshold, the brightest light spot appeared at the end facet of the semiconductor waveguide instead of at the excited plasmon laser cavity region, indicating that laser emission is efficiently coupled into the waveguide. The transition from spontaneous emission to full laser oscillation was clearly visible by both the rapid increase in spectral purity of the plasmon cavity modes (line width narrowing effect) and the clear threshold behavior in integrated light output versus pump response. Note that the current threshold can be reduced dramatically by using a laser with longer pulse, since the pump laser pulse width (~100 fs) used was about $\frac{1}{1000}$th of the spontaneous emission life time. The observed lasing signal at the end of the waveguide originates from the plasmonic cavity mode at the intersection, but is guided to the waveguide facet by the photonic waveguide mode supported in the semiconductor strip waveguide. The efficient conversion of amplified surface plasmons to the directional waveguide emission was evident from an optical image of a lasing device. Integrating the intensity of all emitted light, it was estimated that 80% of the light emission was coupled to the waveguide propagating in both directions away from the laser due to the symmetry of the structure.

It is important to emphasize that the observed plasmon lasing behavior solely originates from the WEB plasmon cavity mode in the intersection region. In a control experiment, the CdS nanobelt was locally excited away from the crossed region at a pump power of 7.4 GW $cm^{-2}$. The obtained spectrum indicated that it was a broad band-edge spontaneous emission of CdS with full width at half maximum of about 18 nm, which is in contrast with the high purity and intense plasmon lasing emission from the WEB plasmon cavity region with full width at half maximum under 2 nm at the same pump power. This is unambiguous evidence that the crossed metal strip and semiconductor waveguide have formed a high quality WEB plasmon laser cavity. The Fabry-Perot mode across the width of CdS nanobelt has radiation loss (estimated to be about $4\times10^4$ $cm^{-1}$) much higher than the metal Ohmic loss due to the small dimensions of width (~620 nm) and thickness (~100 nm) which prevents the lasing from the photonic CdS nanobelt.

In the development of WEB plasmon lasers, cadmium sulfide (CdS) nanobelts were fabricated via a chemical vapor deposition (CVD) process. CdS (99.995%) powders were used as the source with pieces of Si wafers covered with 10 nm of thermally evaporated Au catalysts used as the substrates. The laser devices were constructed from oxidized silicon substrates (100 nm $SiO_2$) with 250 nm thick silver strip arrays with a 5 nm $MgF_2$ layer on top defined by electron beam lithography followed by electron beam evaporation and lift-off processes. For electrical modulation of the waveguide embedded plasmon lasers, In/Au (10/120 nm) ohmic contact electrodes were constructed with electron beam lithography followed by thermal evaporation and lift-off processes. The WEB lasers were optically pumped by a frequency-doubled, mode-locked Ti-sapphire laser with a $\lambda_{pump}$=405 nm, a 10 KHz repetition rate, and an approximately 100 fs pulse length. A 20× objective lens (NA=0.4) was used to focus the pump beam to a ~2 $\mu$m diameter spot onto the sample and collect the luminescence. All experiments were conducted at room temperature.

The experimental observation of efficient directional waveguide coupling from a WEB plasmon laser into a semiconductor waveguide was supported by full wave electromagnetic simulations. The relative momentum and spatial intensity profiles determine the coupling strength between the plasmon cavity mode and the external modes. The effective refractive index of the plasmonic TM mode with a dominant electric field perpendicular to the substrate surface at the intersection region was much higher than that of the modes of pure semiconductor nanobelt and metal strip alone, which is important in forming a high quality plasmon cavity in the crossed region. Simulations were performed of the mode profiles along the direction perpendicular to the metal surface of the semiconductor-insulator-metal gap surface plasmon mode, semiconductor nanobelt waveguide mode, and surface plasmon mode at the Ag-air interface. The thickness of the CdS nanobelt was 100 nm in the simulations. It was seen that the TE mode of the semiconductor waveguide was the most confined mode available with both the best momentum and spatial mode matching with the weaker in-plane electric fields ($E_x$ and $E_y$) of the WEB plasmon cavity mode. Although TM modes of the semiconductor waveguide and silver strip shared the same dominant $E_z$ electric field component in the cavity, they were delocalized and low momentum, leading to both poor momentum and spatial mode matching to the cavity mode. While the weak coupling to all available modes ensured relatively large cavity quality factors, the best momentum and spatial mode matching was achieved for the TE semiconductor waveguide mode leading to the observed preferential coupling to the semiconductor waveguide.

The coupling between the WEB plasmon cavity and various radiation channels was further studied by three dimensional electromagnetic simulations. It was seen that there is a square-shaped plasmon cavity formed in the intersection region due to the high effective index contrast between the surface plasmon mode and the surroundings. The dominant electric field, $E_z$, was confined well in the intersection region. The in plane fields, $E_x$ and $E_y$, can be efficiently coupled to the TE mode of the semiconductor waveguide which is the most confined mode available with both the best momentum and spatial mode matching them. The observed significantly preferential light capture and subsequent guiding by the semiconductor waveguide suggests that mode coupling was stronger between this photonic waveguide and plasmon cavity modes. Significantly, the calculations showed that more than 70% of all the radiated energy from the laser cavity is efficiently coupled to the waveguide with thickness above 60 nm, and about 5% of the energy is coupled to plasmonic modes of the silver strip. A higher efficiency was measured from the scattered light in the aforementioned WEB laser (FIG. 3b) where the energy coupled to the plasmonic modes was not taken into account. When the CdS strip was thinner than 60 nanometers, the cavity still maintains a similar quality factor due to the plasmonic confinement effect, however, the coupling efficiency to the semiconductor waveguide is reduced due to the decreased effective index and the cut-off of photonic waveguide modes. For such thin waveguides, the light scattered to free space increases and the dominant waveguide coupling channel switches to the metal strip, whose surface plasmon mode has the better momentum and spatial mode matching to the WEB plasmon cavity. In this way, WEB plasmon lasers may serve as coherent surface plasmon sources for constructing nanophotonic circuits based entirely on surface plasmons.

Figure 4:
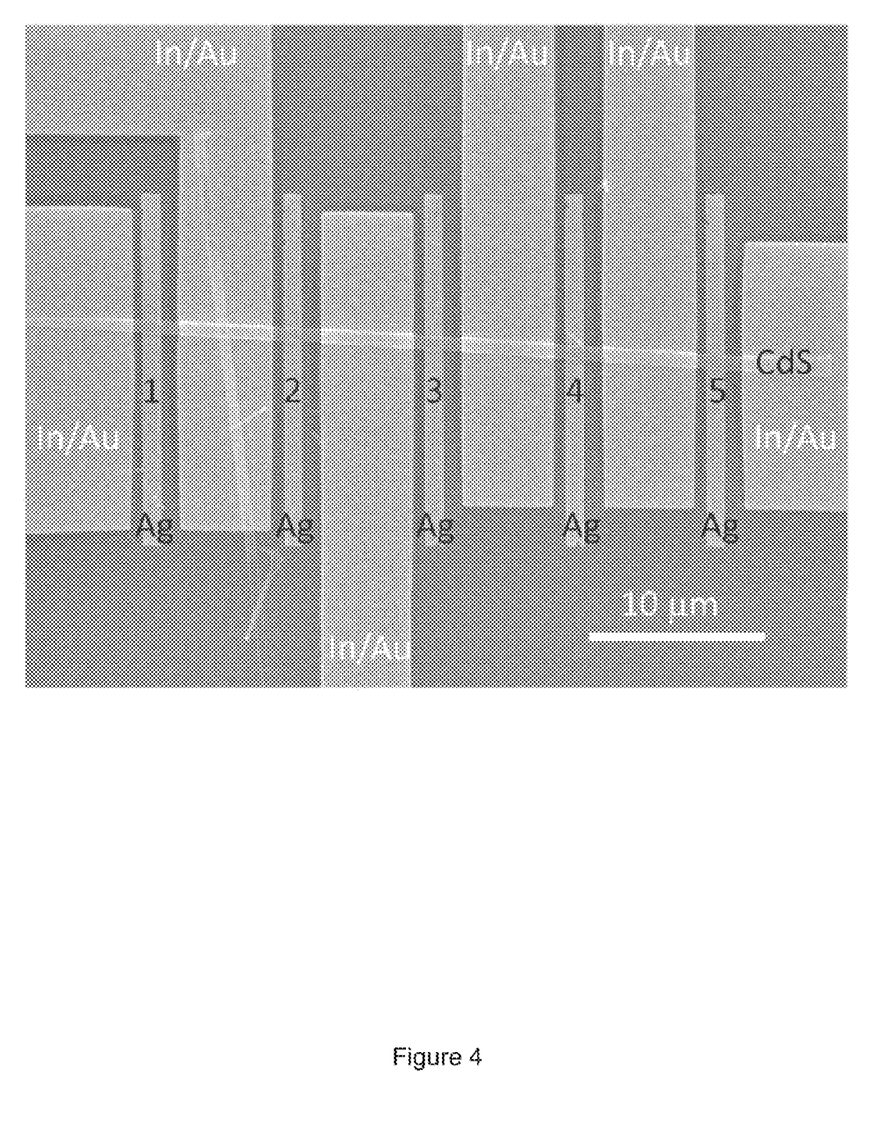
FIG. 4 shows an example of a SEM micrograph of a multiplexed array of WEB plasmon lasers.

FIG. 4 shows an example of a SEM micrograph of a multiplexed array of WEB plasmon lasers. The unique architecture of the WEB plasmon laser allows for implementing multi-color laser arrays and multiplexing them into the same waveguide. With each laser occupying a footprint less than a square micrometer, a five-channel single-mode WEB plasmon laser array multiplexed onto a single semiconductor waveguide was demonstrated by integrating a semiconductor strip onto multiple silver strips fabricated by E-beam lithography. The multiplexed array of WEB plasmon lasers shown in FIG. 4 was assembled from the same CdS strip crossing five silver strips with widths of 1 μm. For electrical interface, In/Au (10/120 nm) ohmic contact electrodes are defined through lithography and lift-off processes.

Each laser can emit a different color because the varying width of the waveguide tunes the resonant condition of plasmon cavity and therefore the emission wavelength. The full width at half maximum of a single mode plasmon laser emission can be narrower than 1 nm. The propagating mode in the semiconductor waveguide is the TE mode with electric field parallel to the substrate surface, which interacts very weakly with both the material discontinuities and the modes of neighboring WEB plasmon cavities. As a result, the emission from each laser device can be effectively transmitted across neighboring cavities, without significant scattering or interference, which allows the embedded waveguide to effectively multiplex the emission of all WEB plasmon lasers. Note that the number of lasing modes can be tuned by the thickness of CdS strip. The single mode operation occurs here because that a thicker CdS strip intersecting a metal strip induced plasmon cavity has weak effective index contrast with CdS nanobelt waveguiding modes and thus supports less square cavity modes.

All the lasing behaviors were verified by two measures: (1) there were clear linear-superlinear-linear transitions in the pump intensity dependence of the total output power curves of all measured lasing devices; and (2) the obtained intensity of lasing cavity mode peaks exceeded the spontaneous emission background by at least one order of magnitude. The spectra evolution, threshold and line width narrowing behaviors of a WEB plasmon laser was recorded. A line width narrowing from about 20 nm to lower than 1 nm around the threshold indicating the onset of lasing was observed. With increasing pump power well above threshold, the spectrum became asymmetrical and the line width slightly broadened. For the large conventional cavity lasers under continuous wave excitation, the line width will decrease inversely with the pump power above threshold due to an increasing degree of population inversion, i.e., the usual Schawlow-Townes behavior. However, for microscale and nanoscale lasers under fast pulsed excitation, the stimulated emission rate can become comparable to phonon relaxation rate that induces electronic nonequilibrium of the gain in the lasing regime. The resulting nonequilibrium energy distribution of carriers gives the broadening and asymmetry of the lasing peak.

Figure 5A:
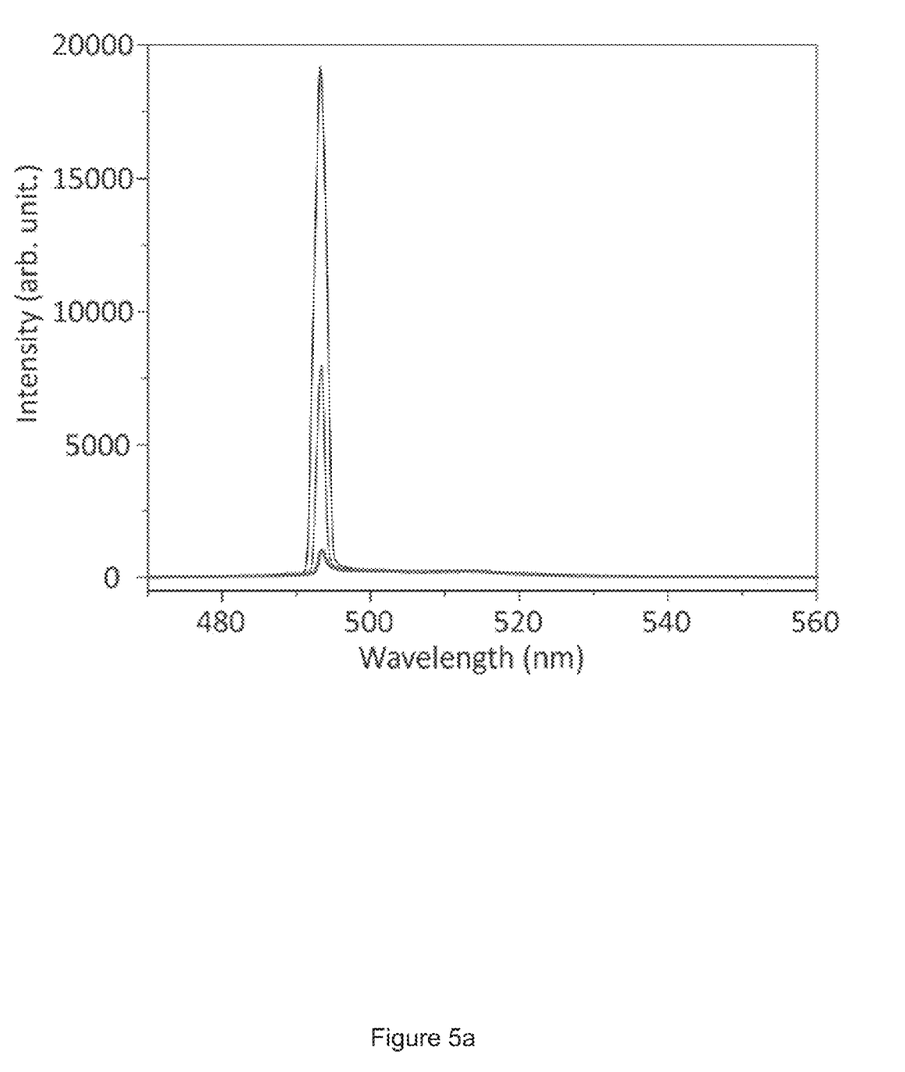
FIGS. 5a and 5b show an example of the direct electrical modulation of a WEB plasmon laser.
Figure 5B:
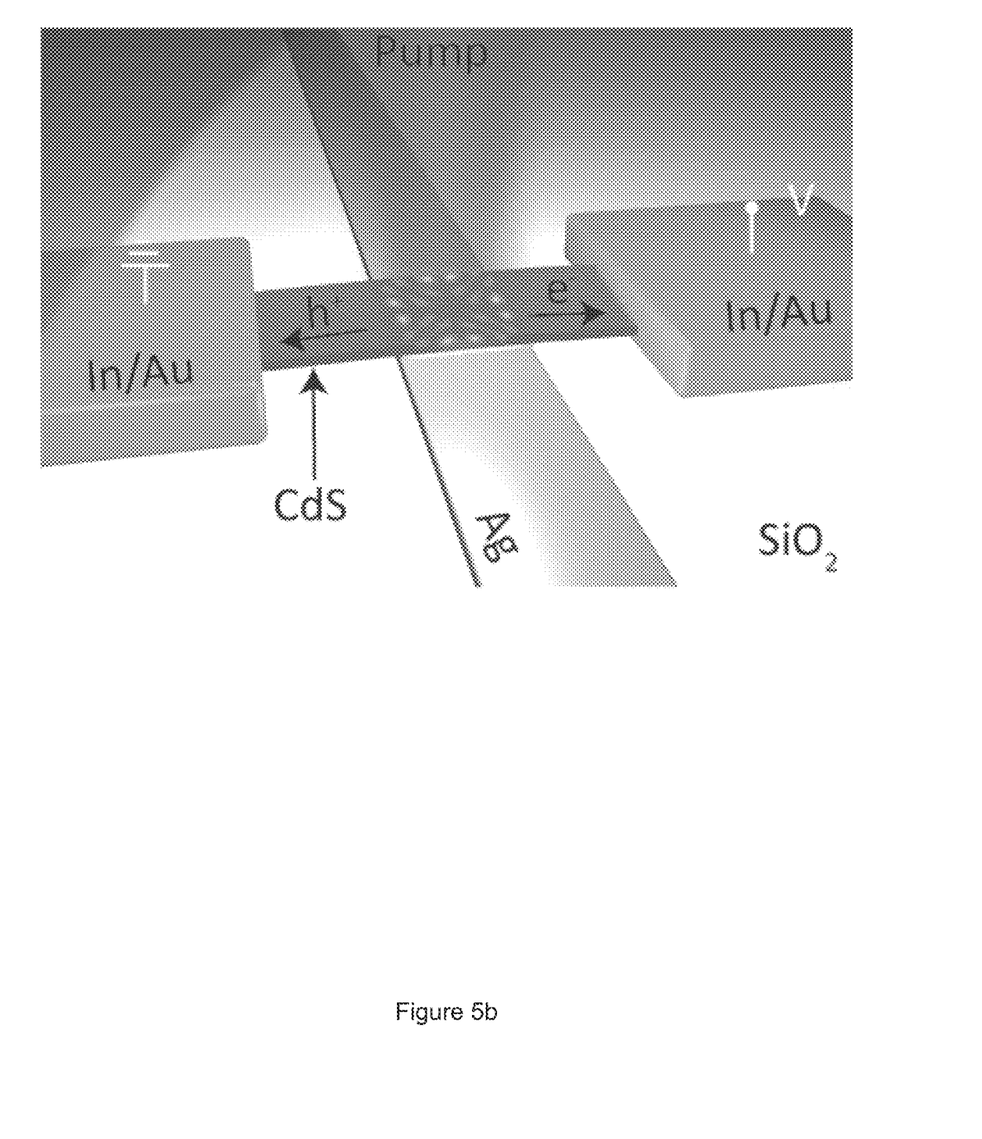

The metal and semiconductor strips forming the plasmon laser cavity not only can serve as out-coupling waveguides, but also can be used as electrical contacts simultaneously, allowing carriers to be transported into and out-of the cavity free from jeopardizing the well confined plasmon modes at all. This unique property was employed to enable direct laser amplitude modulation here, while the opposite operation, injecting electrons and holes into the active cavity region can lead to an electrically pumped semiconductor plasmon laser. FIG. 5a shows an example of the laser spectra of a device under a peak pump intensity of 3.8 GW cm$^{-2}$ under various applied biases for a 1.15 um width, 140 nm thick CdS strip crossing 250 nm thick, 1 μm width silver strip separated by a 5 nm MgF$_2$ gap. In/Au (10/120 nm) ohmic contact electrodes were defined through lithography and lift-off processes. FIG. 5b shows a schematic illustration of the direct electrical modulated WEB plasmon laser.

As shown in FIG. 5b, two In/Au electrodes are integrated at both ends of the waveguide to demonstrate modulation of the laser intensity by extracting electron-hole pairs from the cavity region by biasing the two electrodes. Remarkably, the laser peak intensity can be modulated by 16 dB for a peak bias of 4 V by tuning the electron-hole pair concentration in CdS, and thus the total gain of the laser. A maximum modulation strength of 11 dBV$^{-1}$ was experimentally demonstrated. Since the applied bias changes the density of excited carriers in the cavity, the real part of the refractive index of CdS is also changed due to the plasma dispersion effect. As a result, a linear shift of peak emission wavelength was expected. It is estimated that the carrier density in a lasing WEB plasmon cavity changes by about $4.4 \times 10^{18}$ cm$^{-3}$ for a voltage sweep of 4 V. It is remarkable that this value is of the same order as the inversion density needed in bulk CdS laser despite the much higher loss of a plasmon cavity. This is mainly due to the much higher spontaneous emission 13 factor, spatial gain overlap factor, and Purcell factor of deeply confined plasmon cavity modes compared to that of diffraction limited cavity modes.

The WEB plasmon laser can also achieve unidirectional out coupling by cutting off one out coupling waveguide. Providing the cut is made at the silver nanowire edge, the corresponding cavity boundary would become total internal reflective. Simulations indicated the excellent unidirectional coupling possible. Note that further scaling down the waveguide size is also possible, where the fundamental dipole resonant mode will preferentially couple to metal strip surface plasmon waveguide. A CdS waveguide with lateral dimensions of 60 nm×60 nm and a Ag waveguide with lateral dimensions of 60 nm×60 nm were examined with a three dimensional electromagnetic simulation. It was found that a fundamental dipole mode cavity formed in the cross region and the major emission from the cavity was captured and guided by the sub-diffraction Ag surface plasmon waveguide.

In a plasmon cavity, the total quality factor is usually limited by the metal Ohmic loss. Thus, the devices deliver energy to the nanoscale plasmonic mode but release only a small part of their optical energy to the far field before it is dissipated in the metal. Since the fraction of energy radiating out of the cavity depends on the radiative quality factor relative to the quality factor of the cavity, reducing the radiation quality factor to a certain level can increase the radiation (energy) efficiency of a plasmon laser, while still maintain mediate total quality factor. In the WEB plasmon laser, due to the efficient conversion of surface plasmons in the WEB plasmon cavity to photons propagating in photonic waveguide, the radiation quality factor can be reduced by more than one order of magnitude compared to the plasmon square cavity. The radiative efficiency of the cross cavity is about 35% estimated by the radiative quality factor relative to the quality factor of the cavity, while the estimated radiative efficiency is just about 2% for the square cavity due to a high radiative quality factor. The crossing waveguide configuration has significantly enhanced the percentage of energy coupled out of the plasmon laser.

CONCLUSION

Further details regarding the development and implementations of WEB lasers can be found in the following publications, all of which are herein incorporated by reference:
1. Ren-Min Ma, Xiaobo Yin, Rupert F. Oulton, Volker J. Sorger, & Xiang Zhang, "Directionally emitting plasmon lasers with multiplexing and electrical modulation," FIO Postdeadline Papers, PDPC7 (published Oct. 16, 2011);
2. Ren-Min Ma, Xiaobo Yin, Rupert F. Oulton, Volker J. Sorger, & Xiang Zhang, "Directionality and Integration of Nanoscale Plasmon Lasers," CLEO/QELS Postdeadline Papers, QTh5B.8 (published May 2012); and
3. Ren-Min Ma, Xiaobo Yin, Rupert F. Oulton, Volker J. Sorger, & Xiang Zhang, "Multiplexed and electrically modulated plasmon laser circuit," Nano Letters, 2012, 12 (10), pp. 5396-5402 (published Sep. 18, 2012).

In the foregoing specification, the invention has been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

What is claimed is:

1. A device comprising:
a substrate;
a line of metal disposed on the substrate;
an insulating material disposed on the line of metal; and
a line of semiconductor material disposed on the substrate and the insulating material, wherein the line of semiconductor material overlaying the line of metal, disposed on the insulating material, forms a plasmonic cavity.

2. The device of claim 1, wherein a width of the line of semiconductor material disposed on the insulating material determines a resonant condition of the plasmonic cavity and an emission wavelength of the device.

3. The device of claim 1, wherein a metal of the line of metal includes silver, wherein the insulating material includes magnesium fluoride, and wherein a semiconductor material of the line of semiconductor material includes cadmium sulfide.

4. The device of claim 1, wherein the line of metal is thicker than about 10 nanometers, and wherein the line of metal is about 10 nanometers to 10 micrometers wide.

5. The device of claim 1, wherein the insulating material is about 0.1 nanometers to 50 nanometers thick.

6. The device of claim 1, wherein the line of semiconductor material is about 10 nanometers to 10 micrometers thick and about 10 nanometers to 10 micrometers wide.

7. The device of claim 1, wherein the line of semiconductor material is substantially perpendicular to the line of metal.

8. The device of claim 1, wherein the line of semiconductor material includes a first end and a second end, the device further comprising:
a first electrode associated with the first end; and
a second electrode associated with the second end.

9. The device of claim 1, wherein the line of semiconductor material disposed on the insulating material is configured to be optically pumped, and wherein an end of the line of semiconductor material emits electromagnetic radiation.

10. A device comprising:
a substrate;
a first and a second line of metal disposed on the substrate, the first and the second line of metal being substantially parallel;
an insulating material disposed each of the first and the second line of metal; and
a first, a second, and a third electrode disposed on the substrate, the lines of metal and the electrodes arranged such that the first line of metal is between the first and the second electrodes and the second line of metal is between the second and the third electrodes; and
a line of semiconductor material overlaying the first line of metal, disposed on the insulating material, forming a first plasmonic cavity, and overlaying the second line of metal, disposed on the insulating material, forming a second plasmonic cavity.

11. The device of claim 10, wherein a first width of the line of semiconductor material overlaying the first line of metal determines a resonant condition of the first plasmonic cavity and an emission wavelength of the first plasmonic cavity, and wherein a second width of the line of semiconductor material overlaying the second line of metal determines a resonant condition of the second plasmonic cavity and an emission wavelength of the second plasmonic cavity.

12. The device of claim 11, wherein the first width is different than the second width.

* * * * *